United States Patent
Beckenbaugh et al.

(10) Patent No.: US 11,234,333 B2
(45) Date of Patent: Jan. 25, 2022

(54) SENSING DECAL

(71) Applicant: Peratech Holdco Ltd, Richmond (GB)

(72) Inventors: William Max Beckenbaugh, Chappell Hill, TX (US); Jonathan Sharif Marx Stark, Santa Ana, CA (US)

(73) Assignee: Peratech Holdco Ltd, Catterick Garrison (GB)

( * ) Notice: Subject to any disclaimer, the term of this patent is extended or adjusted under 35 U.S.C. 154(b) by 363 days.

(21) Appl. No.: 16/354,445

(22) Filed: Mar. 15, 2019

(65) Prior Publication Data

US 2019/0289722 A1 Sep. 19, 2019

(30) Foreign Application Priority Data

Mar. 15, 2018 (GB) ...................................... 1804134

(51) Int. Cl.
| | | |
|---|---|---|
| H05K 3/00 | (2006.01) | |
| B41M 3/00 | (2006.01) | |
| G06F 3/00 | (2006.01) | |
| H05K 3/12 | (2006.01) | |
| B41M 5/00 | (2006.01) | |
| G06F 3/041 | (2006.01) | |
| G06F 3/044 | (2006.01) | |
| B33Y 10/00 | (2015.01) | |

(52) U.S. Cl.
CPC .......... *H05K 3/1275* (2013.01); *B41M 3/006* (2013.01); *B41M 5/0011* (2013.01); *G06F 3/041* (2013.01); *G06F 3/044* (2013.01); *H05K 3/1258* (2013.01); *B33Y 10/00* (2014.12); *G06F 2203/04103* (2013.01); *H05K 2203/0143* (2013.01)

(58) Field of Classification Search
CPC .. H05K 3/00; H05K 3/10; H05K 3/12; H05K 3/125; H05K 3/1258; H05K 3/127; H05K 3/1275; B41M 3/00; B41M 3/006; B41M 5/00; B41M 5/001; B41M 5/0011; G06F 3/00; G06F 3/04; G06F 3/041; G06F 3/044
See application file for complete search history.

(56) References Cited

U.S. PATENT DOCUMENTS

| | | | | |
|---|---|---|---|---|
| 3,298,850 A | * | 1/1967 | Lythgoe | B44C 1/162 |
| | | | | 428/155 |
| 2016/0129718 A1 | * | 5/2016 | O'Leary | B44C 1/1712 |
| | | | | 428/32.82 |

FOREIGN PATENT DOCUMENTS

| | | |
|---|---|---|
| JP | 60-187583 A | 9/1985 |
| JP | 2005-349778 A | 12/2005 |
| KR | 20170108508 A | 9/2017 |

* cited by examiner

*Primary Examiner* — Jacob T Minskey
*Assistant Examiner* — Matthew Hoover
(74) *Attorney, Agent, or Firm* — Richard M. Goldberg

(57) ABSTRACT

A method of manufacturing a sensing decal (400), a sensing decal and a method of providing a sensing decal to a device (702), in which the method of manufacture includes providing a flexible release layer (401) having a substantially non-uniform surface (405) and printing a conductive ink layer (402) onto the non-uniform surface. An adhesive layer (403) is printed onto the conductive ink layer to produce the sensing decal. The decal can then be applied to a surface (701) of a device and the flexible release layer is removed.

9 Claims, 8 Drawing Sheets

SENSING DECAL

CROSS REFERENCE TO RELATED APPLICATIONS

This application claims priority from United Kingdom Patent Application number GB 18 04 134.3, filed on 15 Mar. 2018, the whole contents of which are incorporated herein by reference.

BACKGROUND OF THE INVENTION

The present invention relates to a sensing decal, a method of manufacturing a sensing decal and a method of providing such a decal to a device.

Printing of conductive ink layers is known in the prior art and is utilized to create electronic devices such as sensors which require conductive properties. Current printing processes involve obtaining a substrate and printing several conductive and non-conductive layers directly onto the substrate to create a device such as a sensor. This requires several passes of a printing machine. A problem with current procedures of this type is that given that several passes are required, if there is a single defect printed onto the substrate on any one of the layers, the entire sensor is defective and the entire substrate, or sheet, has to be scrapped. This leads to lower yields in terms of manufacture which is undesirable and expensive.

Furthermore, current techniques produce limited flexibility in terms of designs of sensors or other electronic devices. For example, printing multiple layers of material on top of each other on a single substrate to create a sensor means that each of the layers are dependent on the topology of the preceding layer. Current techniques therefore are limited in the type of construction which can be manufactured.

BRIEF SUMMARY OF THE INVENTION

According to an aspect of the present invention, there is provided a method of manufacturing a sensing decal in accordance with the claims.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art.

DETAILED DESCRIPTION OF THE INVENTION

FIG. 1

Figure 1:
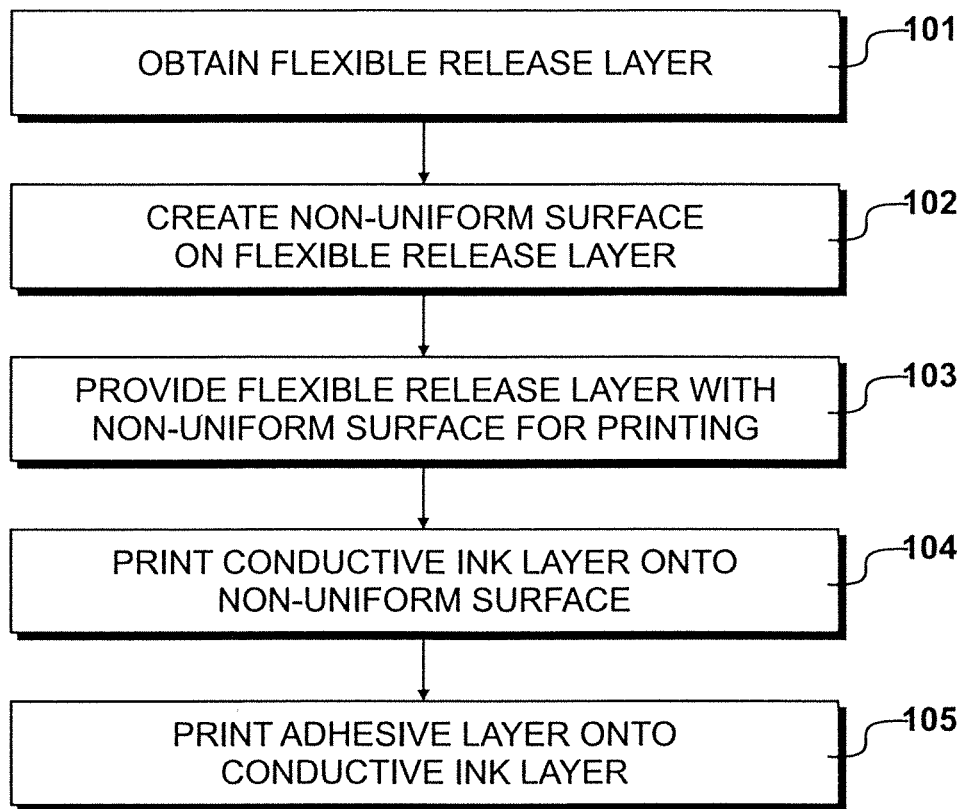
FIG. 1 shows a method of manufacturing a sensing decal.

A method of manufacturing a sensing decal in accordance with the present invention is described with respect to the process shown in FIG. 1.

Figure 4:
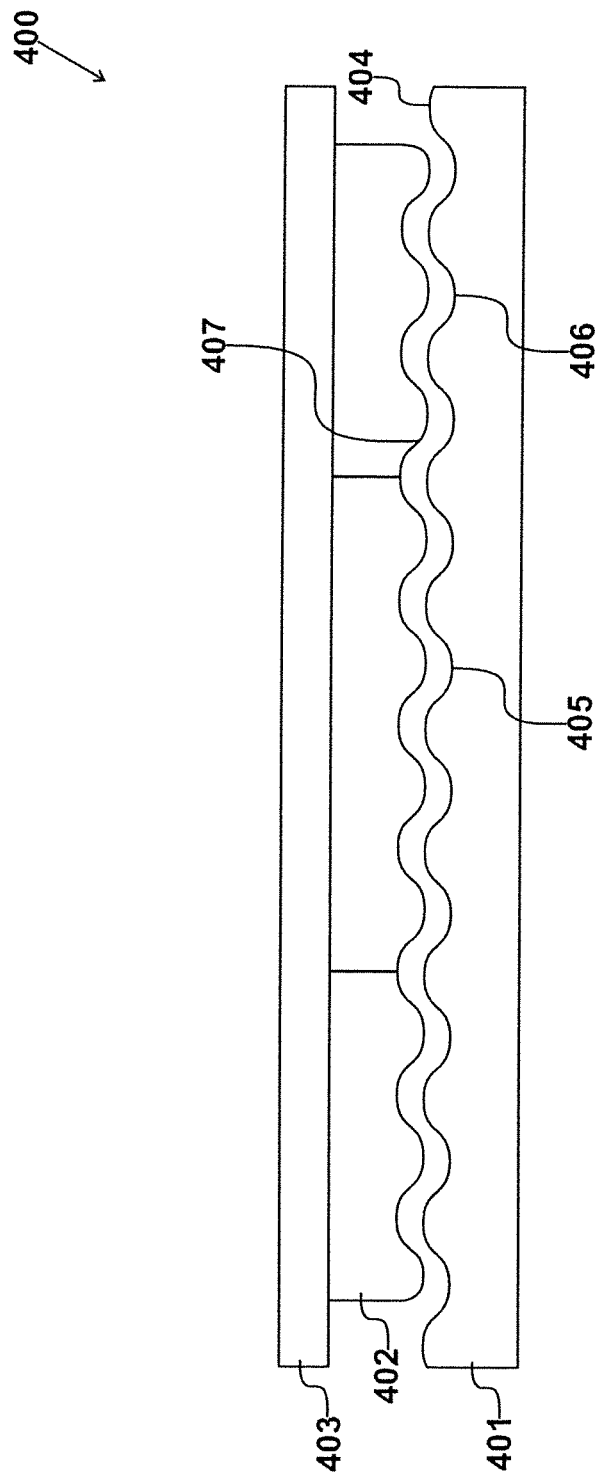
FIG. 4 shows a sensing decal produced by the method of FIGS. 1 to 3.

The manufacturing process is initiated by obtaining a flexible release layer at step 101. The flexible release layer, as will be described further with respect to FIG. 4, is configured to provide a substrate onto which a suitable conductive ink or similar material can be printed. The flexible release layer also provides a material having a sufficient co-efficient of friction to enable the solidified printed ink to be removed from the flexible release layer.

On receipt of the flexible release layer, a non-uniform surface is created on the flexible release layer at step 102. This can be achieved through any number of processes, including, but not limited to, plasma treatment using gaseous fluorination, silane grafting exposures, physical vapor deposition (PVD), atomic layer deposition (ALD), evaporative or sputter deposition, physical micro-indentation or nano-embossing or micro-embossing with a separate pre-patterned surface. Each of these procedures are conducted by known methods in order to produce an effective non-uniform surface, for example, one which comprises indentations or surface roughness.

At step 103, the flexible release layer which now includes a substantially non-uniform surface, is provided for printing and at step 104, a conductive ink layer is printed onto the non-uniform surface. Thus, on application of the conductive ink layer to the non-uniform surface, the conductive ink layer itself is shaped by the non-uniform surface and may be considered to conform to the non-uniform surface.

An adhesive layer is then printed over the top of the conductive ink layer at step 105. Printing steps 104 and 105 comprise any suitable printing process which is known in the art. Thus, in an embodiment, steps 104 and 105 comprise any one of screen printing, ink jet printing, 3D printing, transfer printing by stamping, flexographic printing methods or gravure or rotogravure printing methods. These methods may also be incorporated into a roll-to-roll printing process, as will be described in further detail with respect to FIG. 3.

FIG. 2

Figure 2:
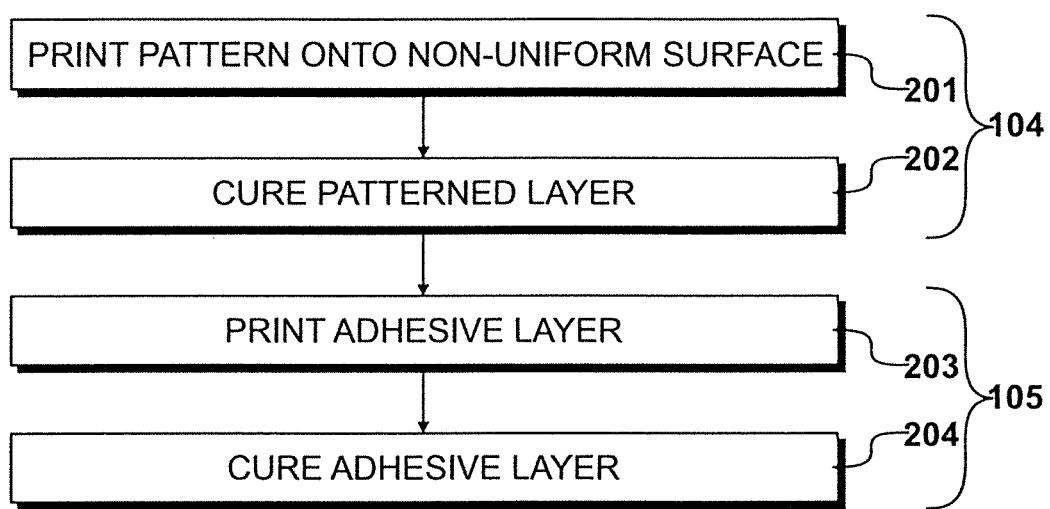
FIG. 2 shows further processes in the method of manufacturing of FIG. 1.

Additional steps in the method of manufacturing a sensing decal are illustrated in FIG. 2. The diagram of FIG. 2 illustrates further detail in respect of steps 104 and 105 of FIG. 1.

In an embodiment, step 104 further includes steps 201 and 202. Thus, the process of printing a conductive ink layer onto the non-uniform surface comprises pre-printing a pattern onto the non-uniform surface. In an embodiment, the pattern may be any suitable conductive ink pattern which may be utilized to create electronic circuitry, as will be explained further with respect to FIG. 5. In particular, in one embodiment, the pattern comprises a plurality of conductive islands which enable a mask to be formed.

Once the conductive ink pattern has been printed, the conductive patterned layer is dried or cured at step 202 before the adhesive layer is printed onto the conductive layer at step 203. At step 204, the adhesive layer is cured or dried so that the decal can be used for conductive electronics and affixed to a suitable device for this purpose.

It is appreciated that, in an embodiment, step 201 comprises a plurality of print cycles in which such that the pattern produced may include conductive sections of alternative thicknesses, properties or arrangements such as those typically found in matrix sensor arrays. The adhesive layer may substantially follow a similar process such that the adhesive layer co-operates with the conductive layer in the final product.

In a further embodiment, the step of printing a conductive layer onto the non-uniform surface involves printing a layer of binder material such as resin onto the non-uniform surface and subsequently applying dispersed electrically conductive particles onto the binder material. A current problem with conventional methods arises in that it is difficult to ensure uniform dispersal of the particles. However, in this method, the particles can be placed onto the binder material to ensure uniform dispersal.

Figure 3:
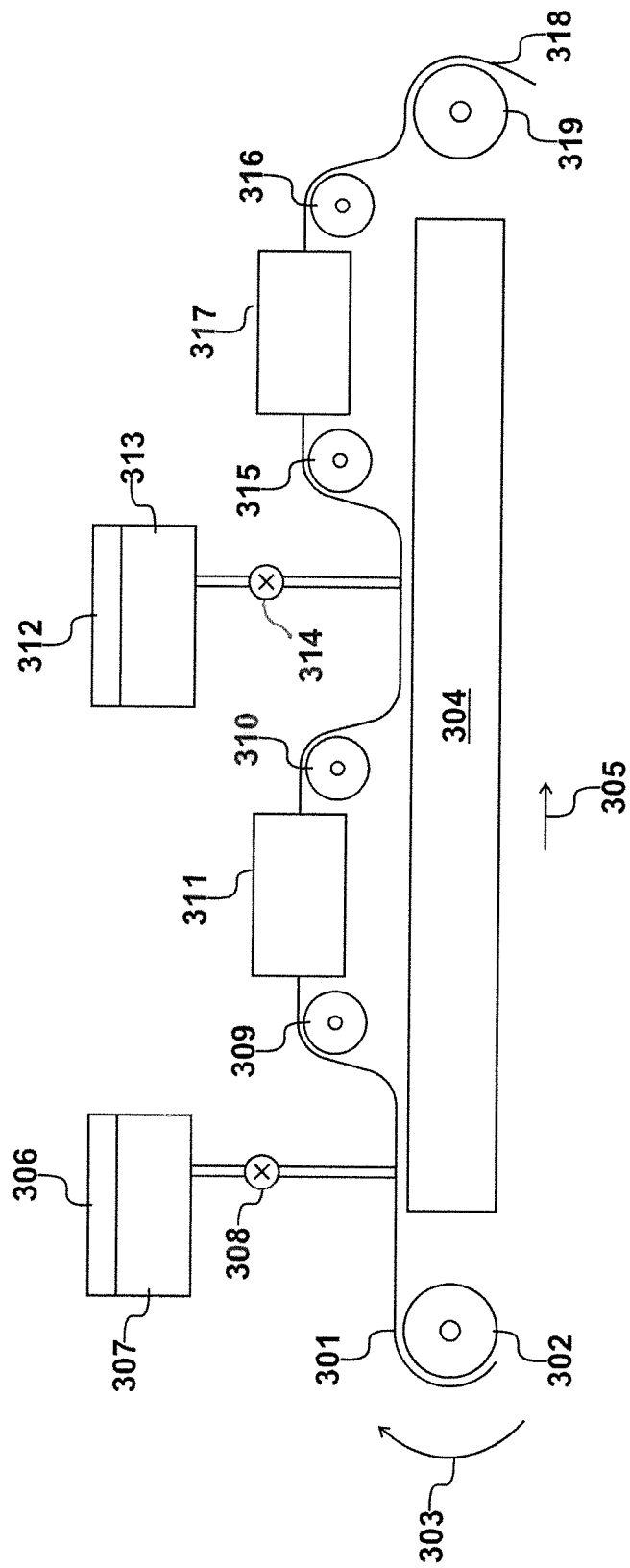
FIG. 3 shows a roll to roll printing process in accordance with the present invention.

As previously described, the printing process described in FIGS. 1 and 2, may be comprised as a roll-to-roll printing process, and this is illustrated further with respect to FIG. 3.

FIG. 3

A flexible release layer 301 having a non-uniform surface is provided and received from a supply reel 302. Supply reel 302 is configured to rotate in the direction of arrow 303 so as to enable flexible release layer 301 to move along a base unit 304 in the direction of arrow 305.

A first supply hopper 306 is provided which includes a supply of suitable conductive ink 307 which can be printed onto flexible release layer 301. In use, conductive ink 307 is released onto flexible release layer 301 via a motorized valve 308. If required, a stencil or similar may be provided such that conductive ink 307 is deposited onto flexible release layer in a predetermined pattern. In an alternative embodiment, motorized valve 308 is regulated to deposit required quantities of conductive ink 307 at predetermined intervals to create a predetermined pattern.

Once conductive ink has been deposited onto flexible release layer 301, the processed flexible release layer moves further along base unit 304 and is supported by rollers 309 and 310. Positioned between the rollers 309 and 310 is a curing machine or a dryer 311 which is configured to ensure the conductive ink solidifies effectively to form a conductive ink layer. In the embodiment, flexible release layer 301 passes through dryer 311 and onto roller 310 before being supported once more by base unit 304.

A second supply hopper 312 is also provided which is similar in its configuration to that of supply hopper 306 but which includes an adhesive material 313 in liquid form which is supplied to flexible release layer 301 via a further motorized valve 314. Adhesive material 313 is therefore deposited onto the surface of the conductive ink layer to form an adhesive layer.

Passing between rollers 315 and 316 and through a further dryer or curing machine 317, the adhesive layer is cured or dried such that it solidifies in a suitable manner for application to a device when necessary. The resultant processed sensing decal 318, comprising a flexible release layer, conductive ink layer and an adhesive layer, is received by an output reel 319, whereby the decal can be further processed or cut accordingly depending on the application.

FIG. 4

An example completed sensing decal produced by the method herein described is shown in FIG. 4.

Sensing decal 400 comprises a flexible release layer 401, conductive ink layer 402 and adhesive layer 403. In accordance with the method described, conductive ink layer is printed onto a first surface 404 of flexible release layer 401. First surface 404 comprises a substantially non-uniform surface 405, which, in this illustrated embodiment, comprises a plurality of indentations, such as indentation 406. In the embodiment, flexible release layer 401 comprises a substantially transparent material and is configured to permit the removal of conductive ink layer 402 in the manner further described with respect to FIG. 7.

Non-uniform surface 405 induces a corresponding non-uniform surface 407 in conductive ink layer 402. In this way, the non-uniform surface of the flexible release layer modifies the surface topography of the conductive ink layer printed thereon. This feature may be utilized to enhance the electrical properties of the conductive ink layer. In the embodiment, conductive ink layer 402 comprises a pressure sensitive resistive material, which, in this embodiment, is a quantum tunneling composite material such as that sold by the present applicant, Peratech Holdco Limited under the trade name QTC™. It is appreciated that other suitable pressure sensitive resistive materials may be utilized in alternative embodiments.

Adhesive layer 403 is printed onto conductive ink layer 402 as previously described. In an embodiment, adhesive layer 403 comprises a pressure sensitive adhesive which is configured to adhere to a surface on the application of a pressure or force. In an embodiment, the pressure sensitive adhesive comprises a wax based material. In an alternative embodiment, the pressure sensitive adhesive comprises a thermoplastic material. In a particular embodiment, the adhesive layer comprises a plurality of electroactive quantum tunneling particles which, in use, combine with the conductive ink layer in a sensing application.

FIG. 5

Figure 5:
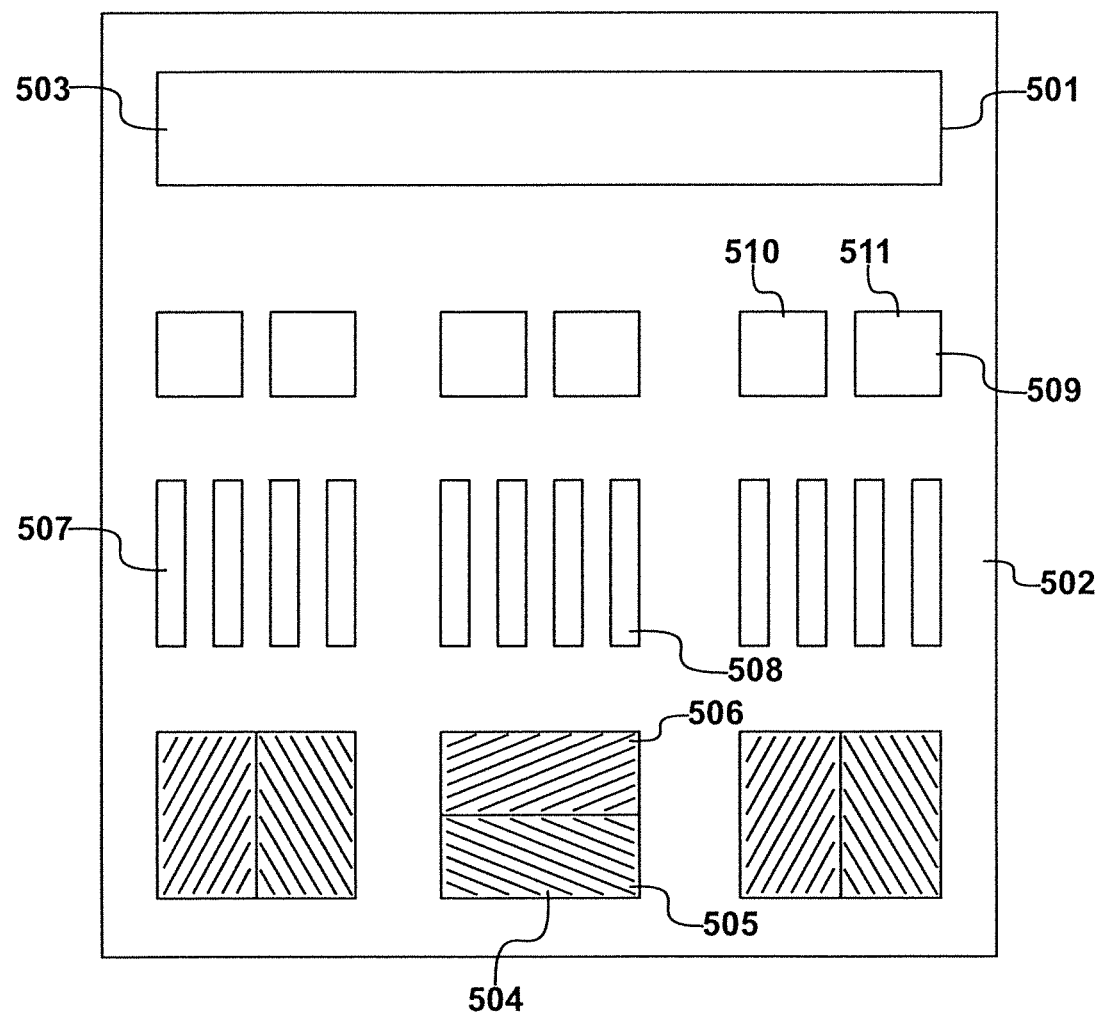
FIG. 5 shows a plurality of patterned elements printed by the method described herein.

An example output from the method described in FIGS. 1 to 3 is shown in FIG. 5. Conductive ink layer 501 is illustrated as a plurality of patterned elements printed onto flexible release layer 502. It is appreciated that conductive ink layer 501 could correspond to conductive ink layer 402 of previous FIG. 4.

In this particular embodiment, conductive ink has been printed to form alternate patterns on a sheet. Each patterned element can be appropriately cut to form a single sensing decal which can then be applied to a surface of a device as necessary. Each of these sensing decals can therefore be considered appropriate patches for manufacture of sensors or other electronic devices such that conductive elements can be applied without the need to directly print to the surface of the device itself.

Patterned element 503 comprises a single block of conductive material which can be utilized as a conductive decal on a device. The conductive material has been printed as a solid element and provides a consistent level of electrical properties. In contrast, patterned element 504 comprises two portions. The first portion 505 has been printed with a given number of layers of conductive ink to provide a predetermined set of electrical properties. The second portion 506 has been printed with an alternative number of layers of conductive ink so as to provide an alternative predetermined set of electrical properties. However, patterned element 504 may be cut to form a single sensing decal which has varied properties across the decal.

Patterned elements 507 and 508 provide alternative patterns whereby each comprises a plurality of rows of conductive ink spaced apart. Thus, the conductive ink layer in these elements provides areas of conduction and areas of insulation. In this way, patterned elements 507 and 508 can be cut into individual decals and combined to form a conventional matrix sensor comprising a plurality of rows and columns.

As a further example, patterned element 509 comprises two conductive islands 510 and 511 which can be utilized to form a single decal. In this way, the sensing decal formed enables a mask to be formed in an electronic device.

It is therefore appreciated that, by varying the patterns printed from the process herein described, various suitable sensing decals can be created by varying the printing process and cutting out the decals ready for application.

FIG. 6

Figure 6:
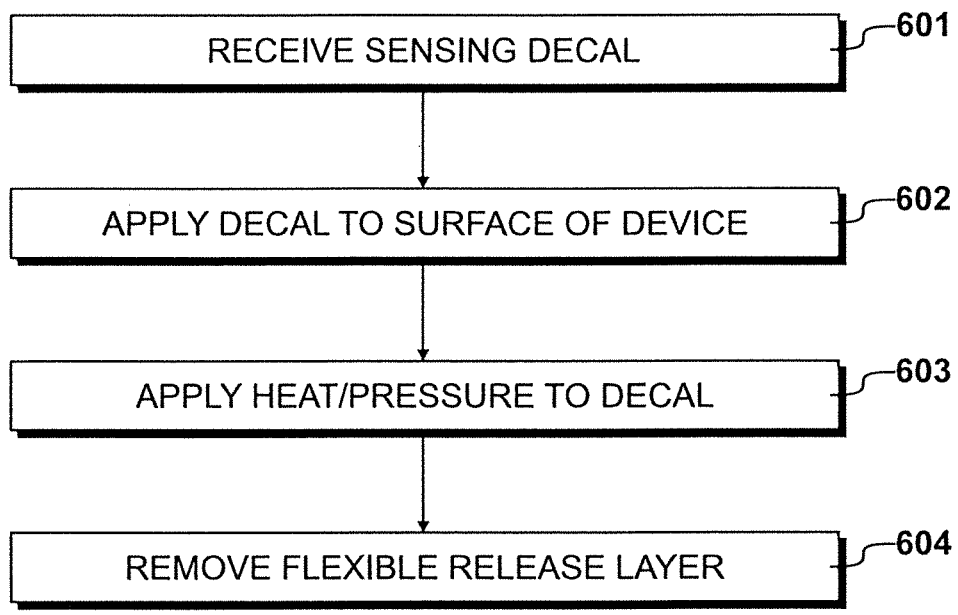
FIG. 6 shows a method of providing a sensing decal to a device.

A method of providing a sensing decal to a device will now be described with respect to FIGS. 6 and 7.

At step 601, a sensing decal such as those previously described with respect to FIGS. 4 and 5 is received ready for application to a surface. At step 602, the sensing decal is applied to a surface of a suitable device such that the adhesive layer of the decal is in contact with the surface. The device may be any suitable device such as a printed circuit board (PCB) or an electronic device, such as a touch screen, portable computer, desktop computer or similar. It is appreciated that any suitable surface which requires a sensing device could be configured to receive a sensing decal in accordance with the present invention.

Once applied to a surface, at step 603 an application of heat, pressure or a combination of heat and pressure is applied to the sensing decal on an outer surface of the flexible release layer. In this way, it is appreciated that the sensing decal comprises a dry transfer decal and does not require the use of water or solvent for application.

At step 604 the flexible release layer is removed from the sensing decal such that the conductive ink layer is retained on the surface of the device, along with the adhesive layer of the decal which is utilized to adhere the decal to the surface.

FIG. 7

Figure 7:
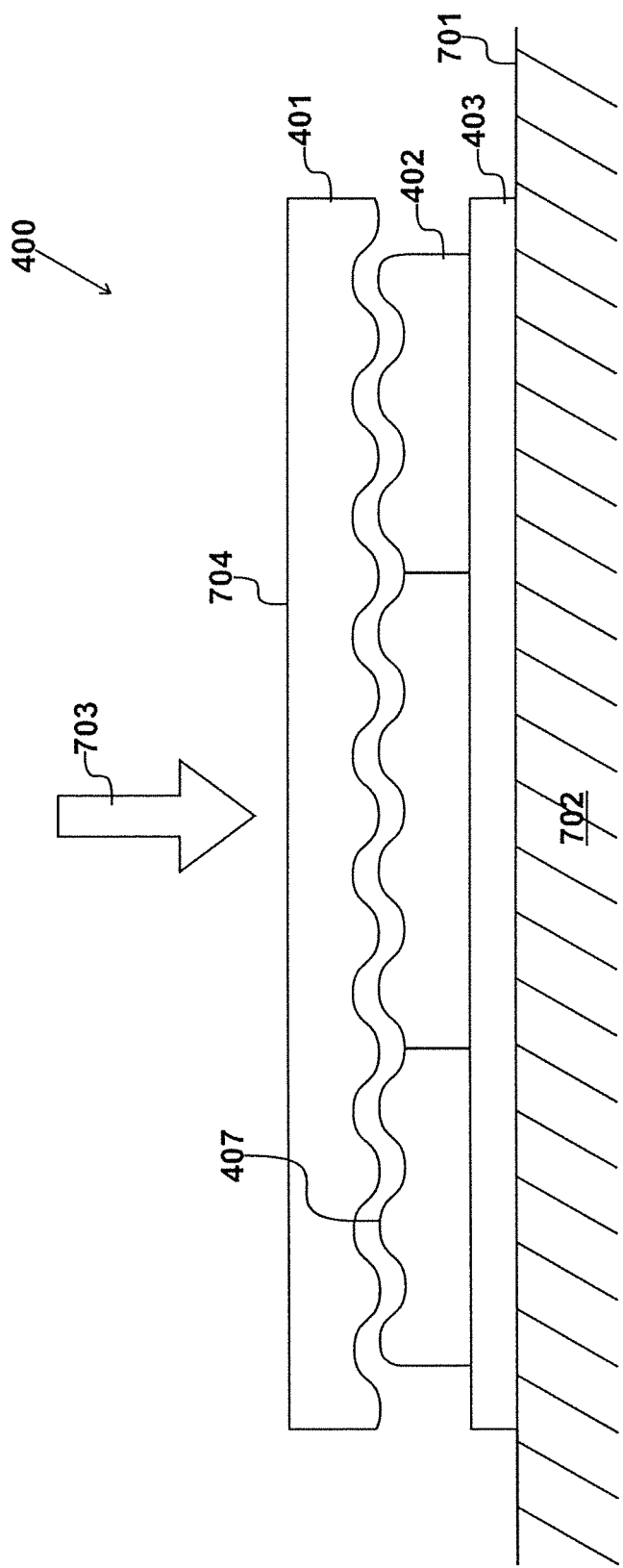
FIG. 7 shows a sensing decal in accordance with the present invention being applied to the surface of a device.

Sensing decal 400 is shown in FIG. 7 being applied to a surface 701 of a device 702. As described in FIG. 6, sensing decal 400 is applied to surface 701 by placing adhesive layer 403 into contact with surface 701.

An application of heat, pressure or a combination of both heat and pressure is applied, indicated by arrow 703 to an outer surface 704 of flexible release layer 401. This results in separation of flexible release layer 401 from conductive ink layer 402, and consequently, flexible release layer 401 can be peeled away from conductive ink layer 402 to leave non-uniform surface 407 exposed. Thus, the surface 407 of conductive ink layer 402 has a topology dictated by the flexible release layer and this can therefore be utilized to take advantage of such properties.

In addition to the embodiment described here, it is appreciated that variations can be made to the flexible release layer 401 so as to provide alternative shapes or structures to the conductive ink layer. In particular, the method described herein permits the surface 407 of the conductive ink layer to be substantially curved to allow for suitable application to curved surfaces for example. Thus, the topography of the conductive layer is dictated by the non-uniform surface of the flexible release layer.

The method is further appreciated to allow for a degree of quality control to be introduced, thereby increasing the yield of parts. In particular, the method allows for several decals to be fabricated separately, and subsequently combined to produce a final sensor or other component. However, each portion can be cross checked before application, without the entire sensor needing to be reprinted, as would be the case in conventional methods of manufacture.

FIG. 8

Figure 8:
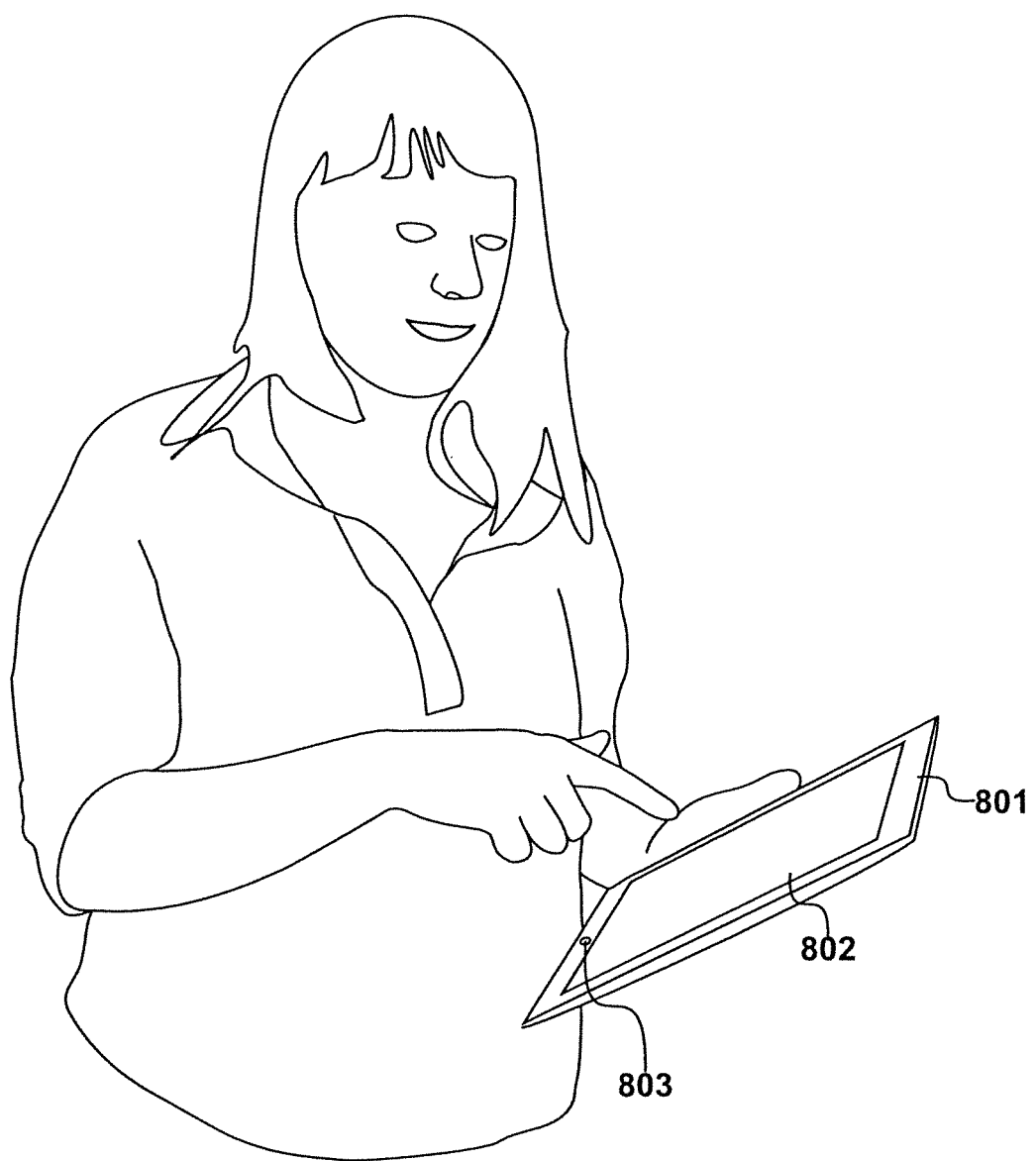
FIG. 8 shows an electronic device incorporating sensing decals in accordance with the present invention.

An example electronic device to which a sensing decal may be applied is illustrated in FIG. 8. Electronic device 801 comprises a touch screen 802 and an input device 803.

In manufacture, sensing decals of the type described herein have been utilized to produce a matrix array sensor which forms touch screen 802 and a single point sensor to form input device 803.

Each of the sensing decals can therefore be produced and forwarded to a construction plant to fabricate the electronic device 801 so that it functions in a conventional manner. The use of such decals however means that the process of fabrication has improved efficiency, quality control and flexibility.

The invention claimed is:

1. A method of manufacturing a sensing decal for use in the production of a sensor, comprising the steps of:
    providing a flexible release layer having a substantially non-uniform surface;
    printing a conductive ink layer on said substantially non-uniform surface; and
    printing an adhesive layer onto said conductive ink layer; wherein
    said step of printing a conductive ink layer comprises pre-printing at least one patterned element, said patterned element providing a predetermined set of electrical properties for formation of a sensor.

2. The method of claim 1, wherein said at least one patterned element comprises a plurality of conductive islands thereby enabling a mask to be formed.

3. The method of claim 1, wherein said at least one patterned element comprises a plurality of rows of conductive ink spaced apart to provide areas of conduction and areas of insulation.

4. The method of claim 1, wherein said at least one patterned element comprises a first portion with a first number of layers of conductive ink and a second portion with a second number of layers of conductive ink.

5. The method of claim 1, said method further comprising a roll-to-roll printing process.

6. The method of claim 1, wherein said steps of printing comprise any one of the following:
    screen printing; ink jet printing; 3D printing; transfer printing by stamping; flexographic printings; gravure printing.

7. The method of claim 1, wherein said step of providing said flexible release layer comprises creating said non-uniform surface by any one of the following processes:
    plasma treatment using gaseous fluorination; silane grafting exposures, physical vapor deposition; atomic layer deposition; evaporative or sputter deposition; physical micro-indentation; nano-embossing or micro-embossing with a separate pre-patterned surface.

8. A method of providing a sensing decal to a device to form a sensor, comprising the steps of:
- receiving a sensing decal comprising a flexible release layer having a substantially non-uniform surface, a conductive ink layer on said substantially non-uniform surface and an adhesive layer on said conductive ink layer, wherein said conductive ink layer comprises at least one patterned element providing a predetermined set of electrical properties;
- applying said sensing decal to a surface of said device such that said adhesive layer is in contact with said surface; and
- removing said flexible release layer such that said conductive ink layer is retained on said surface of said device and utilized to form a sensor.

9. The method of claim 8, wherein said step of removing said flexible release layer comprises the step of:
- applying heat and/or pressure to said sensing decal on an outer surface of said flexible release layer.

* * * * *